United States Patent [19]

Matsuura et al.

[11] Patent Number: 4,537,863
[45] Date of Patent: Aug. 27, 1985

[54] LOW TEMPERATURE SEALING COMPOSITION

[75] Inventors: Ichiro Matsuura; Fumio Yamaguchi, both of Shiga, Japan

[73] Assignee: Nippon Electric Glass Company, Ltd., Otsu, Japan

[21] Appl. No.: 521,896

[22] Filed: Aug. 10, 1983

[51] Int. Cl.$^3$ .............................................. C03C 7/02
[52] U.S. Cl. ....................................... 501/15; 501/17; 501/75; 501/76
[58] Field of Search .................... 501/15, 17, 75, 76

[56] References Cited

U.S. PATENT DOCUMENTS

| | | | |
|---|---|---|---|
| 3,108,887 | 10/1963 | Lenie et al. | 501/98 |
| 3,208,823 | 9/1965 | Baker et al. | 524/493 |
| 3,261,667 | 7/1966 | O'Connor | 423/412 |
| 3,963,505 | 6/1976 | Dumesnil et al. | 501/15 |
| 4,152,182 | 5/1979 | Rutz | 423/412 |
| 4,186,023 | 1/1980 | Dumesnil | 501/15 |
| 4,203,733 | 5/1980 | Tanaka et al. | 501/98 |
| 4,256,495 | 3/1981 | Kawamura et al. | 501/15 |
| 4,301,060 | 11/1981 | Underwood et al. | 524/493 |
| 4,310,357 | 1/1982 | Matsuura et al. | 501/15 |
| 4,352,889 | 10/1982 | Takami et al. | 501/15 |
| 4,360,610 | 11/1982 | Murray et al. | 524/493 |
| 4,421,947 | 12/1983 | Kyle | 501/15 |
| 4,435,513 | 3/1984 | Komeya et al. | 501/96 |
| 4,478,785 | 10/1984 | Huseby et al. | 264/65 |

FOREIGN PATENT DOCUMENTS

| | | | |
|---|---|---|---|
| 58-32072 | 2/1983 | Japan | 501/96 |
| 58-32073 | 2/1983 | Japan | 501/96 |
| 58-151346A | 9/1983 | Japan . | |

OTHER PUBLICATIONS

Ceramic Industry, Jan. 1983, "Tin Oxide", p. 124 of Raw Materials Handbook.
Chem. Abstracts 99: 26974q and 26975r, Jul. 25, 1983.
Circular, GEM-680, Aluminum Nitride, 2 pages, Jun. 1981.

*Primary Examiner*—Helen M. McCarthy
*Attorney, Agent, or Firm*—Kurt Kelman

[57] ABSTRACT

A sealing composition suitable for sealing alumina packages for integrated circuits at a temperature below about 450° C. for a short time of about 10 minutes. The composition is a mixture of 50–80 wt. % vitreous solder glass powder of $PbO-B_2O_3$ system having a deformation point of 350° C. or less, 1–35 wt. % first ceramic powder and 1–45 wt. % second ceramic powder. The total amount of the first and second ceramic powders is 20–50 wt. %. The first ceramic comprises 68–75 wt. % ZnO, 23–28 wt. % $SiO_2$ and 0–8 wt. % $Al_2O_3$, and the second ceramic comprises 98–99.9 wt. % $SnO_2$ and 0.1–2 wt. % ZnO.

5 Claims, 2 Drawing Figures

LOW TEMPERATURE SEALING COMPOSITION

BACKGROUND OF THE INVENTION

This invention relates to sealing compositions and, in particular, to compositions for sealing alumina ceramic packages in which integrated circuits or other solid state devices are encapsulated.

A known sealing composition for sealing alumina ceramic packages comprises a mixture of vitreous solder glass powder, lead titanate powder and zircon (zirconium silicate $ZrSiO_4$) powder, as disclosed in a Japanese patent publication No. 56-49861. This known sealing composition has good mechanical strength and resistance to thermal shock, but radiates α-rays because the zircon includes uranium and/or thorium therein as impurities whereby certain integrated circuits are damaged.

Other sealing compositions are known from Japanese patent publication No. 50-69242 and U.S. Pat. No. 4,310,357. The former discloses a mixture of vitreous glass powder and cordierite powder including β-eucryptite, β-spodumene, zircon and/or lead titanate as optional ingredients, and the latter discloses a mixture of vitreous glass powder and willemite. These sealing compositions are not so high in mechanical strength, and have a tendency to suffer from micro-cracks caused by heat shock resulting in damage to the hermetical seal.

SUMMARY OF THE INVENTION

It is an object of this invention to provide an improved low temperature sealing composition whose sealing temperature is 450° C. or less, which has high resistance to heat shock and high mechanical strength, and a low dielectric constant, which includes no radioactive substances and whose electric resistance is not reduced in long use in an environment of a high temperature and high humidity.

According to this invention, a low temperature sealing composition comprising a mixture of 50–80 wt.% of a vitreous solder glass powder of $PbO-B_2O_3$ having a deformation point of 350° C. or less, 1–35 wt.% of a first ceramic powder and 1–45 wt.% second ceramic powder. The total amount of the first and second ceramic powders is 20–50 wt.%. The first ceramic powder consist of 68–75 wt.% ZnO, 23–28 wt.% $SiO_2$, and up to 8 wt.% $Al_2O_3$. The second ceramic powder consist of 98–99.9 wt.% $SnO_2$ and 0.1–2 wt.% ZnO.

If the solder glass of $PbO-B_2O_3$ system used is devitrifiable, the sealing temperature is elevated so that the sealing composition is not able to seal at 450° C. or less. If the solder glass of $PbO-B_2O_3$ system is vitreous but has a deformation point higher than 350° C., the sealing temperature of the resultant composition is also elevated higher than 450° C. Therefore, the solder glass of $PbO-B_2O_3$ system used must be vitreous and have a deformation point of 350° C. or less.

If the amount of the vitreous solder glass having a deformation point of 350° C. or less used is less than 50 wt.%, the flowability of the composition is reduced so that sealing cannot be performed at a temperature of 450° C. or less. On the other hand, if the amount of the solder glass exceeds 80 wt.%, the thermal expansion coefficient of the composition becomes too high so that resistance to heat shock is reduced.

Therefore, the amount of the vitreous solder glass of $PbO-B_2O_3$ system having a deformation temperature of 350° C. or less must be selected within a range of 50–80 wt.%.

The first ceramic powder is used for lowering the thermal expansion coefficient and the dielectric constant of the sealing composition. If the amount of the first ceramic powder used exceeds 35 wt.%, flowability of the resultant composition is reduced so that sealing cannot be performed at 450° C. or less, and of it less than 1 wt.% raises the thermal expansion coefficient of the composition is raised excessively. Therefore, the amount of the first ceramic powder used is selected within a range of 1–35 wt.%.

The second ceramic is used for increasing the mechanical strength and the thermal conductivity of the sealing composition. If the amount of the second ceramic powder is more than 45 wt.%, the flowability of resultant composition is reduced so that sealing cannot be performed at 450° C. or less. While use of the less than 1 wt.% of the second ceramic powder lowers the mechanical strength of the seal. Accordingly, the amount of the second ceramic powder is selected within a range of 1–45 wt.%.

However, when the total amount of the first and second ceramic powders used is less than 20 wt.%, the thermal expansion coefficient of the composition is too high so that the resistance to heat shock is reduced. While, when the total amount of them is more than 50 wt.%, the flowability of the composition is reduced so that sealing cannot be completed at 450° C. or less. Therefore, the total amount of the first and second ceramics must be selected within a range of 20–50 wt.%.

Further objects, features and other aspects of this invention will be understood from the following description of preferred embodiments referring to the accompanying drawings.

DETAILED DESCRIPTION OF PREFERRED EMBODIMENTS

Figure 1:
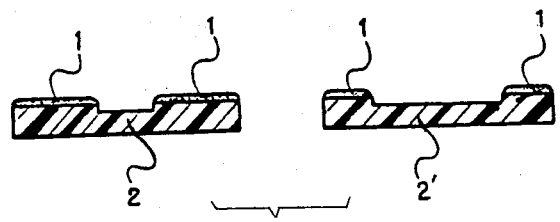
FIG. 1 is a sectional view of a pair of alumina ceramic parts for an alumina package, on which a paste of a sealing composition of this invention is printed.

A preferred composition of the vitreous solder glass of $PbO-B_2O_3$ system used in this invention comprises 80–86 wt.% PbO, 11.0–13.0 wt.% $B_2O_3$, 0.5–2.0 wt.% $SiO_2$, 0–5 wt.% ZnO, 0–2 wt.% $Al_2O_3$, and 0–2 wt.% $Fe_2O_3$.

Four example glasses Nos. 1–4 as listed in Table I were produced by using red lead, boric acid, silica sand, aluminum hydroxide, lead fluoride, and zinc oxide as the materials for respective ingredients of the glasses. Those materials were weighed and mixed according to weight percent indicated in Table I. The batch for each of glasses Nos. 1–4 was melted at 900° C. for 30 minutes in a platinum crucible.

TABLE 1

|  | Ex. Gl. 1 | Ex. Gl. 2 | Ex. Gl. 3 | Ex. Gl. 4 |
| --- | --- | --- | --- | --- |
| PbO (wt. %) | 84.8 | 84.3 | 81.5 | 85.3 |
| $B_2O_3$ (wt. %) | 12.3 | 11.9 | 12.0 | 12.7 |
| $SiO_2$ (wt. %) | 1.0 | 1.0 | 1.0 | 1.0 |
| ZnO (wt. %) | 1.4 | 2.8 | 4.0 | — |
| $Al_2O_3$ (wt. %) | 0.5 | — | — | 1.0 |
| $F_2O_3$ (wt. %) | — | — | 1.5 | — |

TABLE 1-continued

|  | Ex. Gl. 1 | Ex. Gl. 2 | Ex. Gl. 3 | Ex. Gl. 4 |
|---|---|---|---|---|
| Deformation Temp. (°C.) | 327 | 325 | 305 | 330 |

The molten glass was quenched between counter rotating stainless steel rollers. The resultant glass flake was milled in an alumina ball mill and then was screened through 150 mesh screen of stainless steel.

The first ceramic material used in this invention comprises 68–75 wt.% ZnO, 23–28 wt.% $SiO_2$, and up to 8 wt.% $Al_2O_3$, as described hereinabove.

An example of the first ceramic material is presented in Table II which was produced by using zinc oxide, sillica sand and alumina as its raw materials. Those raw materials were weighed and mixed. The batch was fired at 1440° C. for 15 hours.

TABLE II

| ZnO | $SiO_2$ | $Al_2O_3$ |
|---|---|---|
| 70.6 (wt. %) | 24.7 (wt. %) | 4.7 (wt. %) |

The resultant ceramic material was milled in an alumina ball mill and then was screened through 325 mesh stainless steel screen. The thermal expansion coefficient of the ceramic obtained was $15 \times 10^{-7}/°C$.

The second ceramic material used in this invention comprises 98–99.9 wt.% $SnO_2$ and 0.1–2 wt.% ZnO, as described hereinabove.

An example of the second ceramic material as presented in Table III was produced by using stannic oxide and zinc oxide as its raw materials.

TABLE III

| $SnO_2$ | ZnO |
|---|---|
| 99 (wt. %) | 1 (wt. %) |

The raw materials were weighed and mixed and fired in an oxidizing atmosphere at 1400° C. for 15 hours. The resultant material was milled in an alumina ball mill and then screened through a 325 mesh screen of stainless steel. The ceramic obtained had a thermal expansion coefficient of $40 \times 70^{-7}/°C$.

Each glass powder of glasses Nos. 1–4 in Table I, the example of the first ceramic material powder in Table II and the example of the second ceramic material powder in Table III were weighed and mixed with one another according to weight percent listed in Table IV.

Each mixture of Nos. 1–7 in Table IV was mixed with a suitable vehicle to form a paste. An example of the vehicle used is α-terpineol solution of 5% acrylic resin. Each paste was used for sealing a package for integrated circuits, according to a conventional sealing method. A sealing method is exemplarily described below.

The paste is printed onto respective sealing surfaces of alumina ceramic base 2 and cap 2' to form thin layers 1 of the paste of 0.3 mm thickness as shown in FIG. 1. The alumina ceramic parts 2 and 2' are then heated to about 390° C. at a rate of 5° C./min. and kept at that temperature for 1 minute to vaporize the vehicle in the paste so that a sealant layer (as shown at 1 in FIG. 1) is formed and fixed onto the sealing surface of each ceramic part 2 and 2'.

TABLE IV

|  | Exp. 1 | Exp. 2 | Exp. 3 | Exp. 4 | Exp. 5 | Exp. 6 | Exp. 7 |
|---|---|---|---|---|---|---|---|
| Ex. Gl.1 (wt. %) | 60.6 | 58.0 | 65.5 | — | — | — | — |
| Ex. Gl.2 (wt. %) | — | — | — | 56.5 | 67.8 | — | — |
| Ex. Gl.3 (wt. %) | — | — | — | — | — | 57.6 | — |
| Ex. Gl.4 (wt. %) | — | — | — | — | — | — | 61.00 |
| First Ceramic (wt. %) | 16.4 | 8.9 | 24.5 | 2.0 | 30.2 | 18.4 | 19.0 |
| Second Ceramic (wt. %) | 23.0 | 33.1 | 10.0 | 41.5 | 2.0 | 24.0 | 20.0 |
| Thermal Expansion Temp. ($\times 10^{-7}$ °C.) | 67 | 70 | 65 | 73 | 64 | 66 | 65 |
| Deformation Temp. (°C.) | 335 | 335 | 330 | 335 | 325 | 310 | 320 |
| Shearing Strength of Sealed Package (Kg) | 350 | 370 | 320 | 400 | 310 | 320 | 315 |
| Resistance to Heat Shock | 0/20 | 0/20 | 0/20 | 0/20 | 0/20 | 0/20 | 0/20 |
| Dielectric Constant (1 MHz) | 13.5 | 15.5 | 12.1 | 18.0 | 12.0 | 15.8 | 12.5 |

Figure 2:
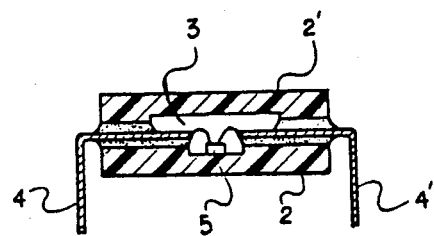
FIG. 2 is a sectional view of an I.C. package sealed by the use of the sealing composition of this invention.

Then, an IC element 5 is mounted by the use of Au-alloy in a cavity portion 3 of alumina ceramic base 2. Thereafter, alumina ceramic base 2 is put on a hot-plate heated at about 450° C. to soften the sealant 1 so as to fix leads 4 and 4' by the sealant softened. Leads 4 and 4' are bonded to IC element 5. Thereafter, alumina ceramic cap 2' is superposed onto the base 2 to cover the IC element 5. Then, the superposed base and cap are inserted into an electric furnace, and heated to 440° C. at a rate of 50° C./minute, and then held at the temperature for 10 minutes to seal the alumina package, as shown in FIG. 2.

The resistance to heat shock of the resultant package and the shearing strength along the longer side of the package were examined.

Heat shock test was performed according to the MIL-STD-883B; Method 1011.2; Condition C, that is, the sealed package was subjected to 15 cycles of thermal elevation and drop between 150° C. and −65° C. and the damage of hermeticity (or leak) of the package was examined.

In Table IV, the sharing strength and the resistance to heat shock are presented. In Table IV, the resistance to heat shock is given by a ratio of number of samples damaged by the heat shock test to the number of all samples tested. None of 20 packages sealed by using each sealing composition of the examples Nos. 1–7 was damaged after the heat shock test. It will be noted from the test data that the sealing compositions according to this invention are excellent in mechanical strength and resistance to heat shock.

In Table IV, the expansion coefficient, deformation point and dielectric constant at 1 MHz of each example sealing composition of Nos. 1–7 are also presented. It will be also noted from the data that the sealing compositions according to this invention are suitable for sealing alumina packages.

Furthermore, packages sealed by using the composition of this invention were placed in an environment of a temperature of 65° C. and of a relative humidity of 90% for 1000 hours with an electric voltage of 40 V applied between a pair of leads. No leakage current still presented between the pair of leads.

Acid resistance of the low temperature sealing composition of the invention was tested by soaking it in 20% sulfuric acid solution at a temperature of 70° C. for 1 minute. A weight loss of only 0.3 mg/cm$^2$ was observed. After soaking it in 10% hydrochloric acid solution at 20° C. for 10 minutes, the weight loss was 4.0 mg/cm$^2$ or less. And after soaking it in 10% nitric acid solution at room temperature for 10 minutes, the weight loss was 200 mg/cm$^2$. These data mean that the low temperature sealing composition of this invention has a property of acid resistance sufficient to withstand the actual acid treatment process and/or plating process.

The low temperature sealing composition of this invention is usable for sealing not only packages for integrated circuits but also display panels or the like.

What is claimed is:

1. A low temperature sealing composition for a seal of high mechanical strength between two alumina ceramic parts to form a sealed package having a shearing strength of at least 310 kg, the sealing composition having a sealing temperature of no more than 450° C. and consisting essentially of a mixture of 50–80 wt.% of a vitreous solder glass powder of $PbO-B_2O_3$ system having a deformation point of 350° C. or less, 1–35 wt.% of a first ceramic powder and 1–45 wt.% of a second ceramic powder, the total amount of said first and second ceramic powders being 20–50 wt.%, said first ceramic powder consisting of 68–75 wt.% ZnO, 23–28 wt.% $SiO_2$ and up to 8 wt.% $Al_2O_3$, and said second ceramic powder consisting of 98–99.9 wt.% $SnO_2$ and 0.1–2 wt.% ZnO.

2. A low temperature sealing composition as claimed in claim 1, wherein said solder glass powder consists of 80–86 wt.% PbO, 11.0–13.0 wt.% $B_2O_3$, 0.5–2.0 wt.% $SiO_2$, 0–5 wt.% ZnO, 0–2 wt.% $Al_2O_3$, and 0–2 wt.% $F_2$.

3. A low temperature sealing composition as claimed in claim 1, wherein said solder glass powder is fine enough to pass a standard 150 mesh screen.

4. A low temperature sealing composition as claimed in claim 1, wherein said first ceramic powder is fine enough to pass a standard 325 mesh screen.

5. A low temperature sealing composition as claimed in claim 1, wherein said second ceramic powder is fine enough to pass a standard 325 mesh screen.

* * * * *

UNITED STATES PATENT AND TRADEMARK OFFICE
CERTIFICATE OF CORRECTION

PATENT NO. : 4,537,863
DATED : AUGUST 27, 1985
INVENTOR(S) : I. MATSUURA ET AL

It is certified that error appears in the above-identified patent and that said Letters Patent are hereby corrected as shown below:

Cover page, item 56, Referenced cited, delete the entire section and insert the following references:

--U.S. Patent Documents

| | | | |
|---|---|---|---|
| 3,963,505 | 6/1976 | Dumesnil et al | 501/15 |
| 4,186,023 | 1/1980 | Dumesnil | 501/15 |
| 4,256,495 | 3/1981 | Kawamura et al | 501/15 |
| 4,310,357 | 1/1982 | Matsuura et al | 501/15 |
| 4,352,889 | 10/1982 | Takami et al | 501/15 |
| 4,421,947 | 12/1983 | Kyle | 501/15 |

Foreign Patent Documents
58-151346A    9/1983    Japan

Other Publications
Ceramic Industry, Jan. 1983, "Tin Oxide", p. 124 of Raw Materials Handbook.--

Signed and Sealed this

Twenty-fourth Day of December 1985

[SEAL]

Attest:

DONALD J. QUIGG

Attesting Officer    Commissioner of Patents and Trademarks